(12) United States Patent
Peng et al.

(10) Patent No.: US 7,679,898 B2
(45) Date of Patent: Mar. 16, 2010

(54) AIR FLAP MECHANISM FOR SERVER CHASSIS

(75) Inventors: Wen-Tang Peng, Taipei Hsien (TW); Xin-Hu Gong, Shenzhen (CN); Jie Yang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 37 days.

(21) Appl. No.: 11/967,055

(22) Filed: Dec. 29, 2007

(65) Prior Publication Data
US 2009/0154114 A1 Jun. 18, 2009

(30) Foreign Application Priority Data
Dec. 12, 2007 (CN) .................... 2007 1 0203011

(51) Int. Cl.
*G06F 1/16* (2006.01)
*H05K 5/00* (2006.01)
*H05K 7/00* (2006.01)
(52) U.S. Cl. .................... 361/679.37; 361/679.39
(58) Field of Classification Search ......... 361/679.37, 361/379.38, 679.39, 728, 754, 797
See application file for complete search history.

(56) References Cited

U.S. PATENT DOCUMENTS

| | | | | |
|---|---|---|---|---|
| 3,800,328 A | * | 3/1974 | Harlan et al. ............ 360/137 |
| 4,006,616 A | * | 2/1977 | Rubner et al. ............ 70/455 |
| 4,817,079 A | * | 3/1989 | Covington ............... 720/728 |
| 5,345,351 A | * | 9/1994 | Krohn ................. 360/96.51 |
| 5,351,228 A | * | 9/1994 | Kanno et al. ............ 720/647 |
| 5,355,358 A | * | 10/1994 | Van Alfen .............. 720/647 |
| 5,559,672 A | * | 9/1996 | Buras et al. ........... 361/679.32 |
| 5,701,216 A | * | 12/1997 | Yamamoto et al. ....... 360/96.51 |
| 6,377,451 B1 | * | 4/2002 | Furuya ................. 361/754 |
| 6,421,247 B1 | * | 7/2002 | Fuchimukai ............. 361/797 |
| 6,747,877 B2 | * | 6/2004 | Tonozuka ............... 361/797 |
| 6,804,082 B2 | * | 10/2004 | Komatsu et al. ........ 360/99.02 |
| 7,499,271 B2 | * | 3/2009 | Wagatsuma et al. ....... 361/726 |
| 7,508,683 B1 | * | 3/2009 | Jochym et al. .......... 361/818 |
| 2004/0217072 A1 | * | 11/2004 | Bash et al. ............. 361/692 |
| 2007/0217142 A1 | * | 9/2007 | Wagatsuma et al. ....... 361/685 |
| 2007/0217143 A1 | * | 9/2007 | Wagatsuma et al. ....... 361/685 |

* cited by examiner

*Primary Examiner*—Jayprakash N Gandhi
*Assistant Examiner*—Adrian S Wilson
(74) *Attorney, Agent, or Firm*—Frank R. Niranjan

(57) ABSTRACT

An air flap mechanism is installed in a server chassis with an opening. A functional module is capable of being inserted into the server chassis from the opening. The air flap mechanism includes an air flap pivotably installed in the server chassis for shielding the opening of the server chassis and a pair of first torsion springs attached to the air flap. A connecting bar connects between the first torsion springs for being driven by an end of the functional module to pivot the air flap inside the server chassis when the functional module is pushed into the server chassis.

14 Claims, 9 Drawing Sheets

AIR FLAP MECHANISM FOR SERVER CHASSIS

BACKGROUND

1. Field of the Invention

The present invention relates to air flap mechanisms, and more particularly to an air flap mechanism for preventing air outside the server chassis from flowing into the server chassis and interfering with the normal air flow inside the server chassis.

2. Description of Related Art

Generally, an opening is formed at one end of a server chassis via which a functional module is inserted into or drawn out of the server chassis. An air flap is pivotably attached to the server chassis for shielding the opening so that the air outside the server chassis is prevented from flowing therein to interfere with the regulated airflow inside the sever chassis. The functional module typically includes some connectors extending from an end thereof. When the functional module is pushed into the server chassis, the connectors strike the air flap and may be damaged or damage the air flap.

What is desired, therefore, is an air flap mechanism for minimizing the impact on the connectors of the functional module during installation into a server chassis.

SUMMARY

An exemplary air flap mechanism is installed in a server chassis with an opening. A functional module is capable of being inserted into the server chassis from the opening. The air flap mechanism includes an air flap pivotably installed in the server chassis for shielding the opening of the server chassis and a pair of first torsion springs attached to the air flap. A connecting bar connects between the first torsion springs for being driven by an end of the functional module to pivot the air flap inside the server chassis when the functional module is pushed into the server chassis.

Other advantages and novel features of the present invention will become more apparent from the following detailed description of embodiment when taken in conjunction with the accompanying drawings, in which:

DETAILED DESCRIPTION

Figure 1:
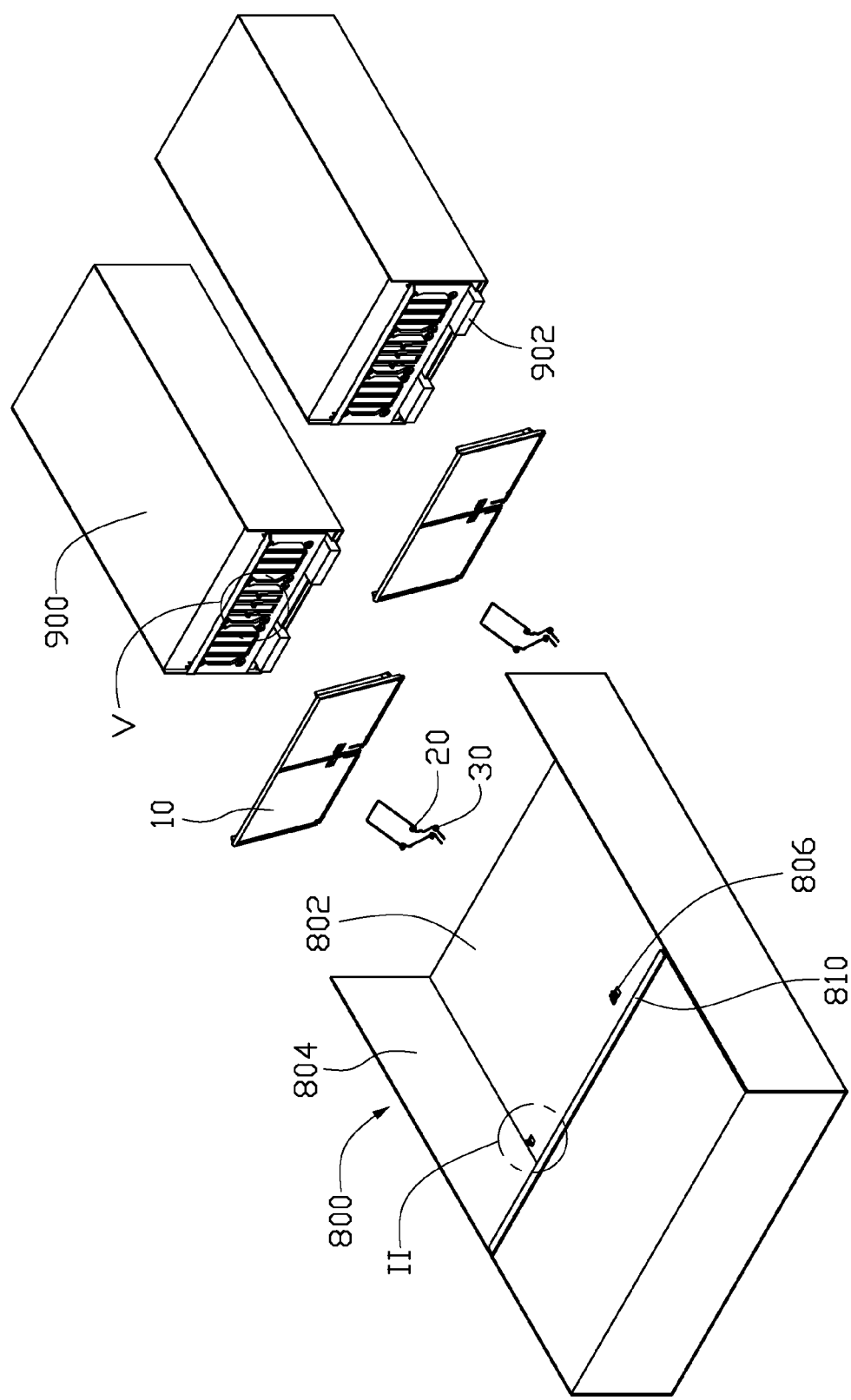
FIG. 1 is an exploded, isometric view of air flap mechanisms in accordance with an embodiment of the present invention, together with a server chassis and a pair of functional module.
Figure 2:
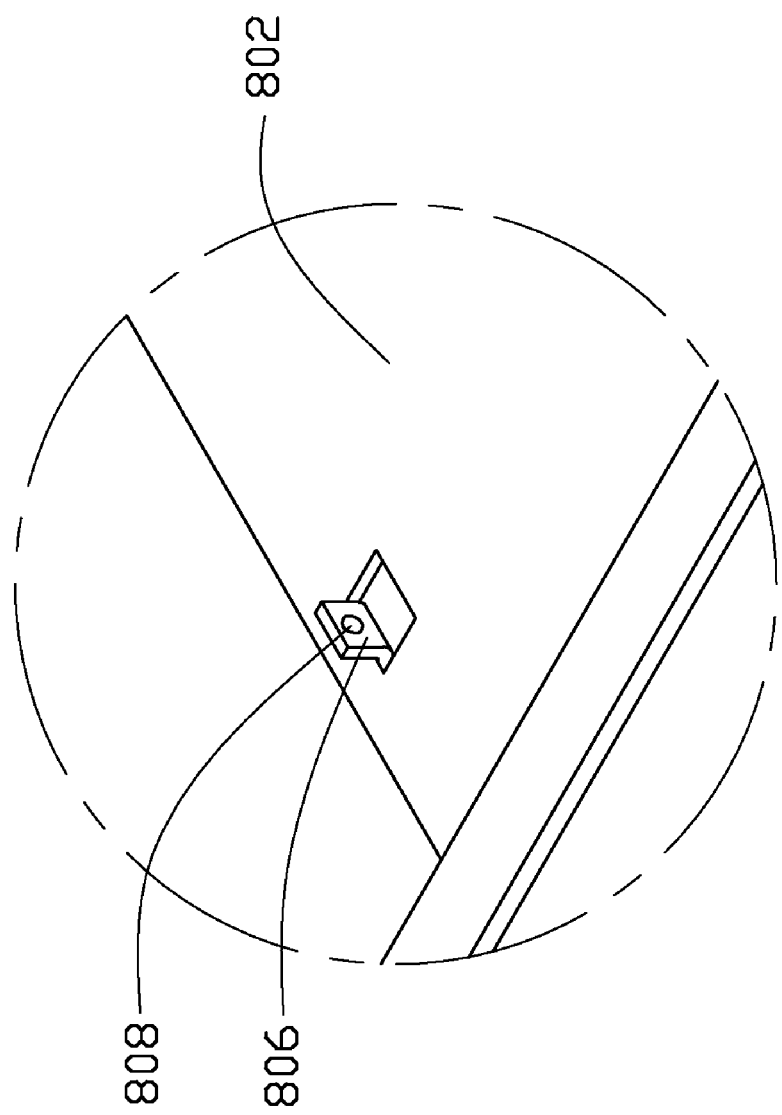
FIG. 2 is an enlarged view of an encircled portion 11 of FIG. 1.

Referring to FIGS. 1 and 2, an air flap mechanism in accordance with an embodiment of the present invention are installed in a server chassis 800 for preventing air outside the chassis 800 from entering and interfering with the regulated airflow inside the chassis 800. The air flap mechanism includes an air flap or a cover 10, a pair of first torsion springs 20, and a pair of second torsion springs 30 correspondingly connecting with the first torsion springs 20.

Figure 5:
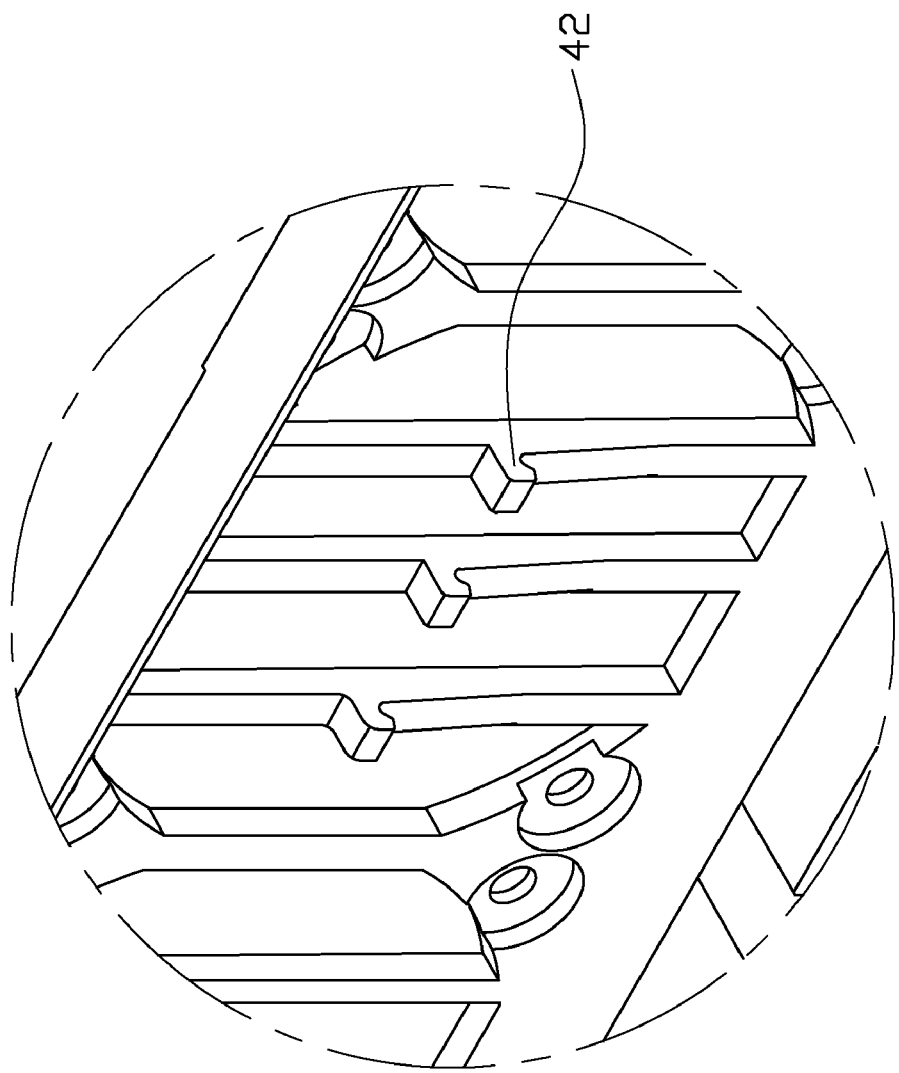
FIG. 5 is an enlarged view of an encircled portion V of FIG. 1.

The chassis 800 includes a bottom wall 802 and opposite sidewalls 804 vertically extending upward from opposite edges of the bottom wall 802 respectively. The bottom wall 802 and the sidewalls 804 cooperatively form a space capable of receiving a pair of functional modules 900. Two pairs of tabs 806 are formed on the bottom wall 802. Each tab 806 has a pivoting hole 808 defined therein. A plurality of connectors 902 extends from the lower portion of a front end of each functional module 900. A plurality of hooks 42 (see FIG. 5) is formed on the upper portion of the front end of each functional module 900. A backplane 810 with a plurality of connectors 812 (see FIG. 7) is defined in the chassis 800. The connectors 902 of the functional modules 900 are capable of mating with the corresponding connectors 812 of the backplane 810.

Figure 3:
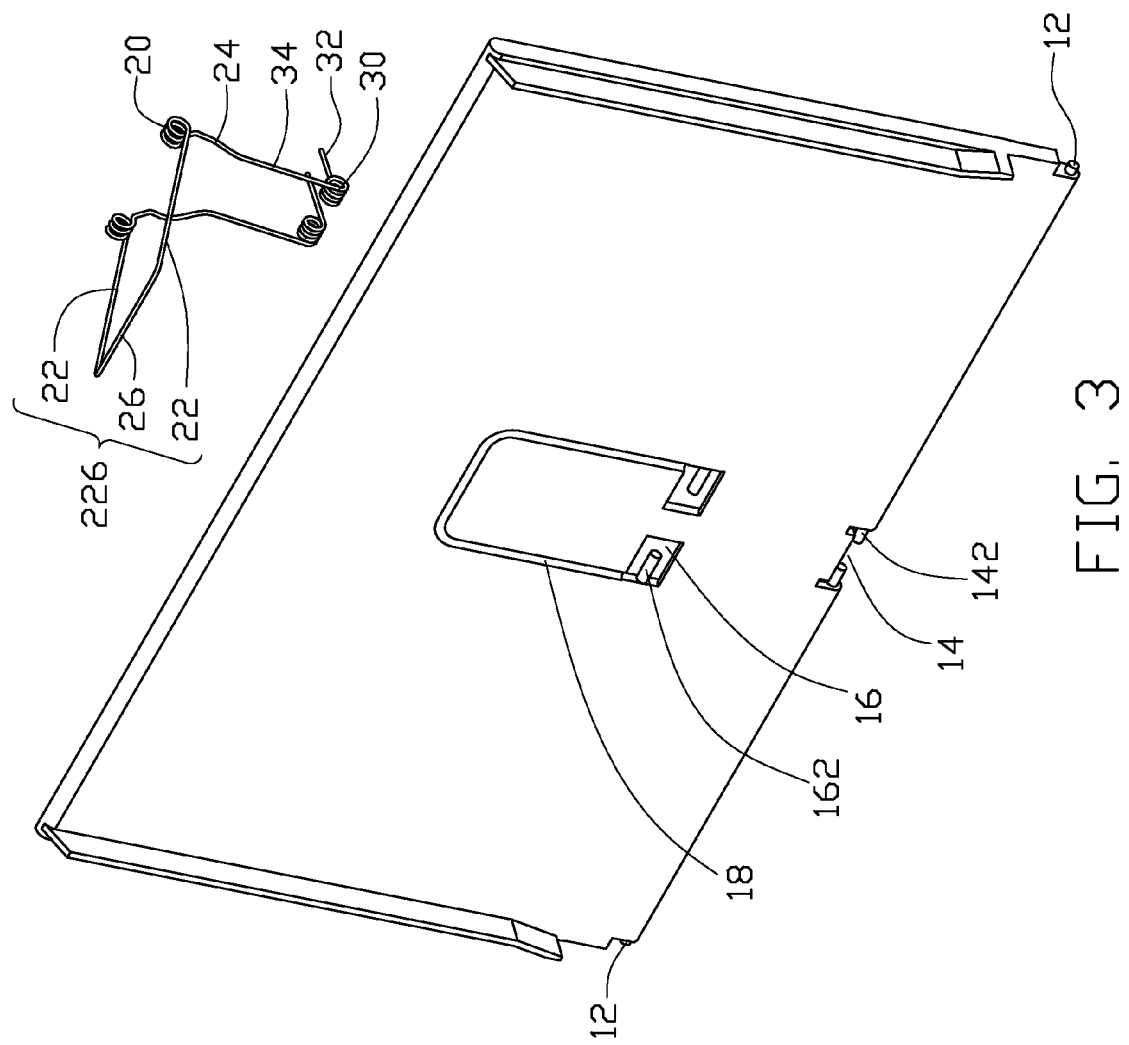
FIG. 3 is an enlarged view of one of the air flap mechanisms of FIG. 1.
Figure 4:
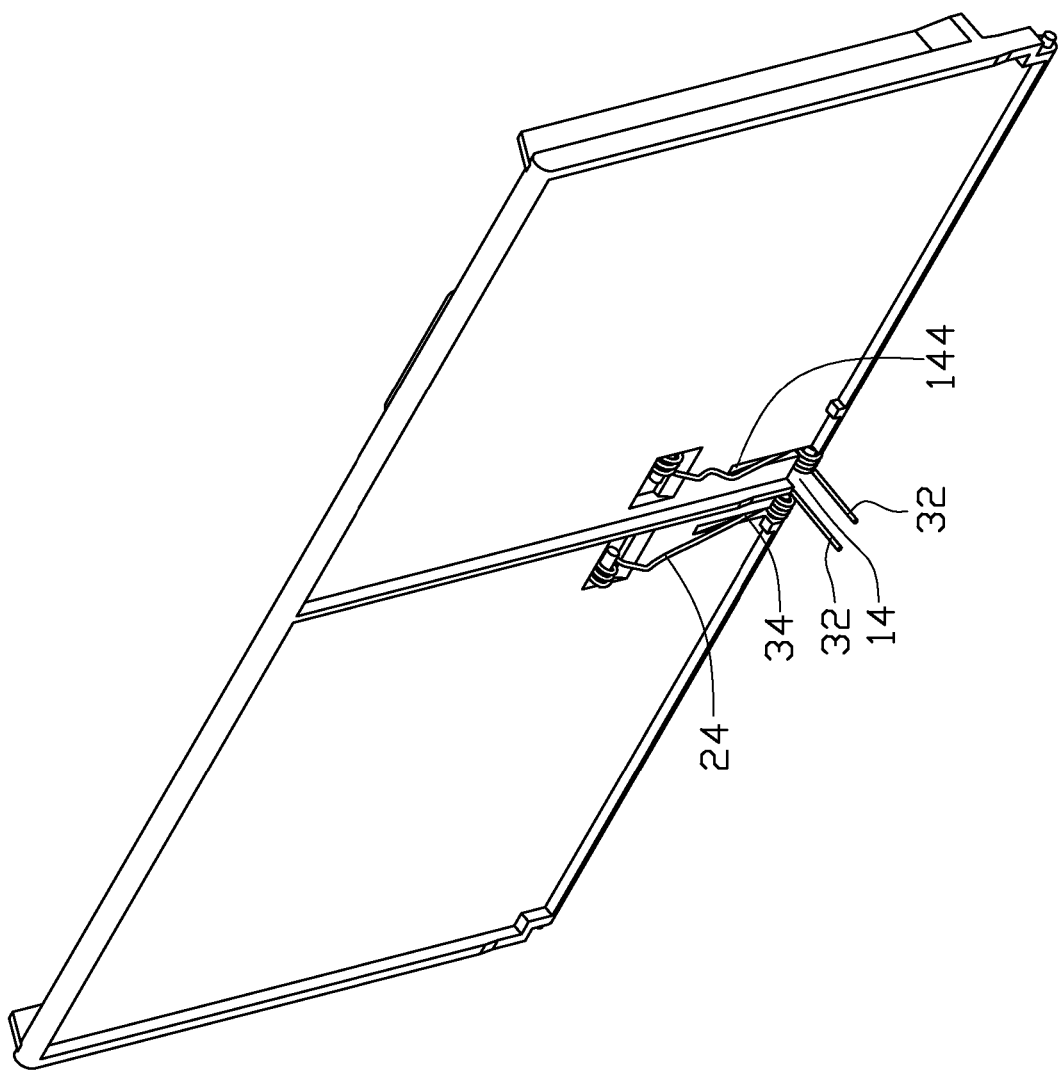
FIG. 4 is an assembled view of the air flap mechanism of FIG. 3.

Referring also to FIGS. 3 and 4, a pair of posts 12 is respectively formed on the bottom end of opposite side edges of the air flap 10. An upside down U-shaped receiving groove 18 is defined in a first surface of the air flap 10. Two through holes 16 are defined in the air flap 10 and communicate with the two ends of the receiving groove 18 respectively. A pair of first protruding portions 162 is formed on the air flap 10 extending toward each other in the corresponding through holes 16. A cutout 14 is defined in the air flap 10 and arranged at the center of the bottom edge of the air flap 10. A pair coaxially aligned posts 142 is formed at opposite sides of the cutout 14 extending toward each other. Two parallel channels 144 are defined in a second surface opposite to the first surface and in communication with opposite ends of the cutout 14, respectively.

A pair of first torsion arms 22 respectively extends from the first torsion springs 20. A connecting bar 26 connects between the first torsion arms 22. The first torsion springs 20 and the connecting bar 26 cooperatively form a connecting member 226 configured for being received in the receiving groove 18. Each first torsion spring 20 further includes a second torsion arm 24. Each second torsion spring 30 includes a third torsion arm 32 and a fourth torsion arm 34 extending from opposite ends thereof. The fourth torsion arms 34 of the second torsion springs 30 integrally connect with the corresponding second torsion arms 24 of the first torsion springs 20 to be received in corresponding channels 144 of the air flap 10.

Figure 6:
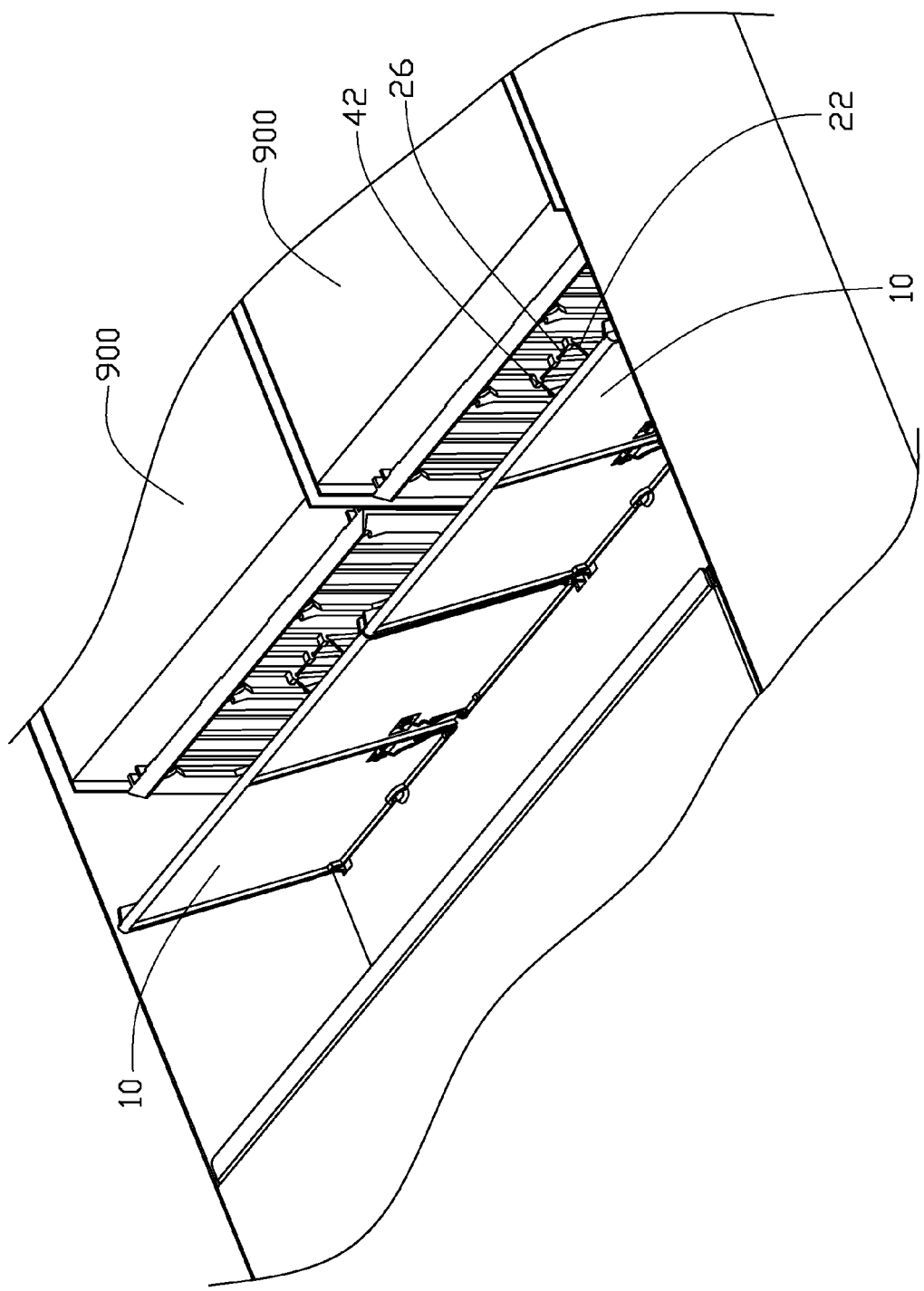
FIG. 6 is an assembled view of FIG. 1.

Referring also to FIG. 6, in assembly, the first torsion springs 20 are placed around the corresponding first protruding portions 162 of the air flap 10. The second torsion springs 30 are placed around the corresponding second protruding portions 142 of the air flap 10. The first torsion arms 22 of the first torsion springs 20 extend out of the first surface of the air flap 10. The second torsion arms 24 of the first torsion springs 20 and the corresponding fourth torsion arms 34 of the second torsion springs 30 abut against the second surface of the air flap 10. The fourth torsion arms 34 of the second torsion springs 30 are partially received in the channels 144. The posts 12 of the air flap 10 are pivotably received in the pivoting holes 808 of the corresponding tabs 806 and the third torsion arms 32 of the second torsion springs 30 abut against the bottom wall 802 of the chassis 800, so that the air flap 10 is installed in the chassis 800 with the connecting member 226 extending towards the opening of the chassis 800.

Figure 7:
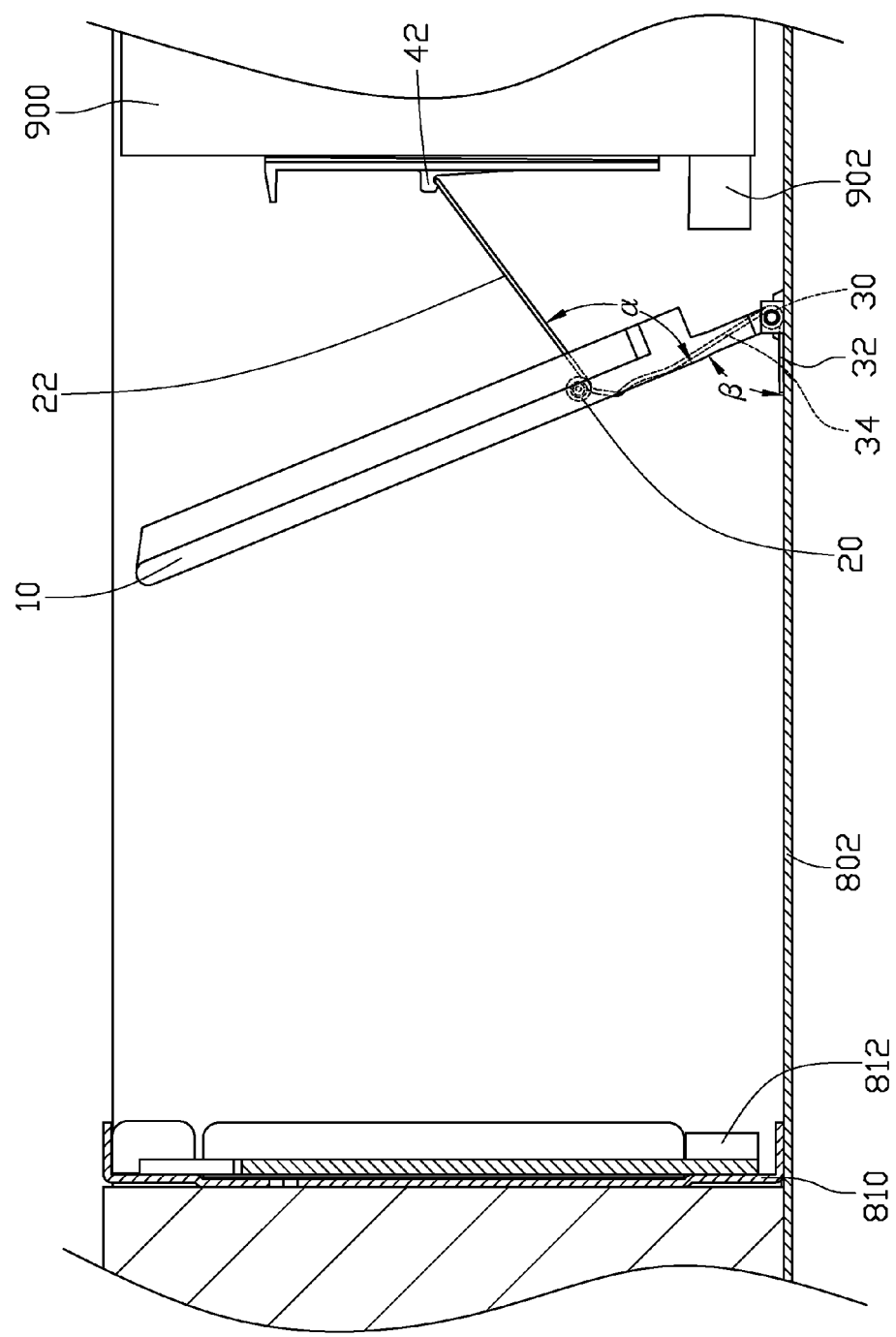
FIGS. 7 to 9 are partial sectional view respectively showing a functional module being inserted into a server chassis in accordance with the embodiment.
Figure 8:
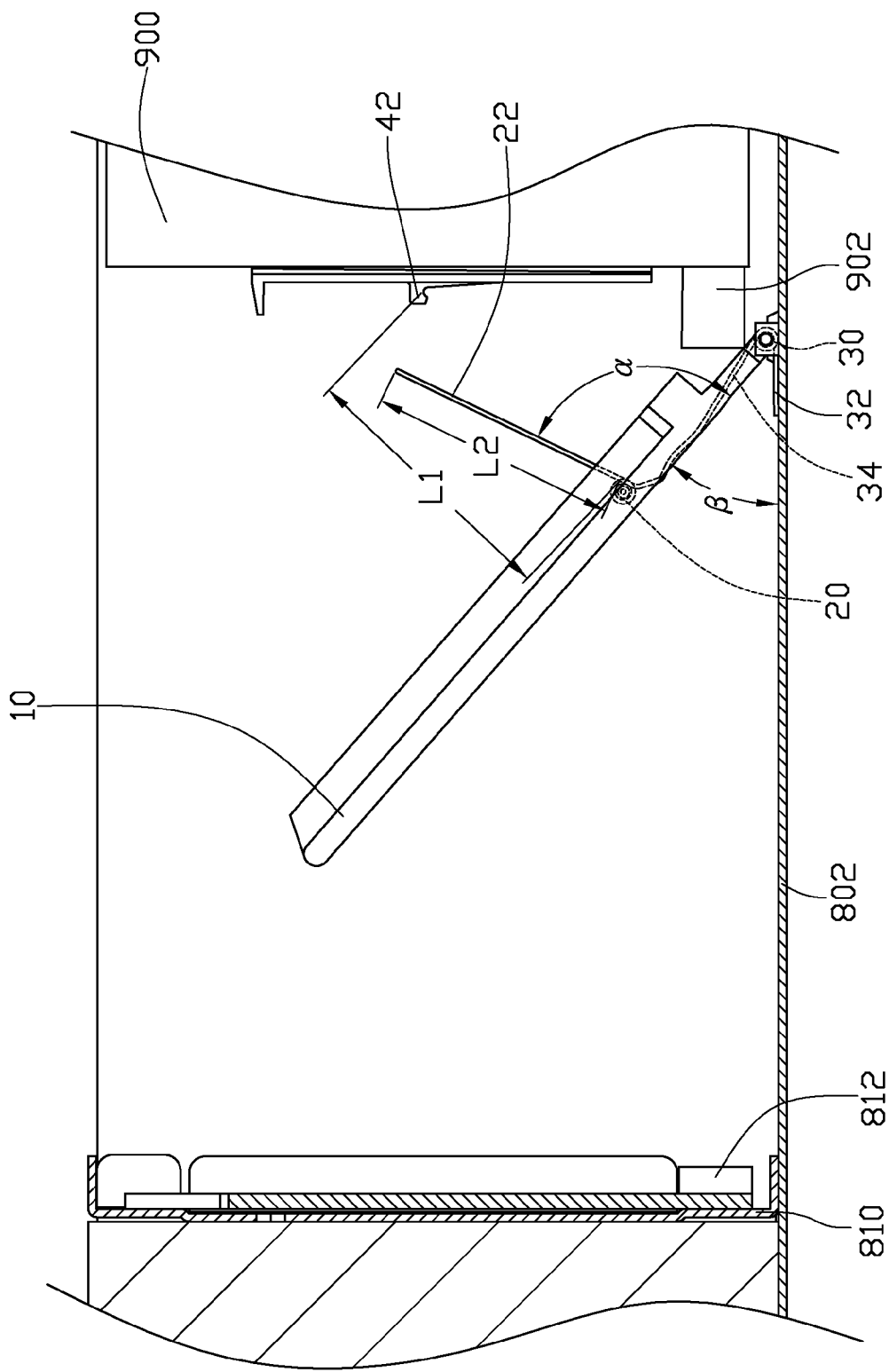
Figure 9:
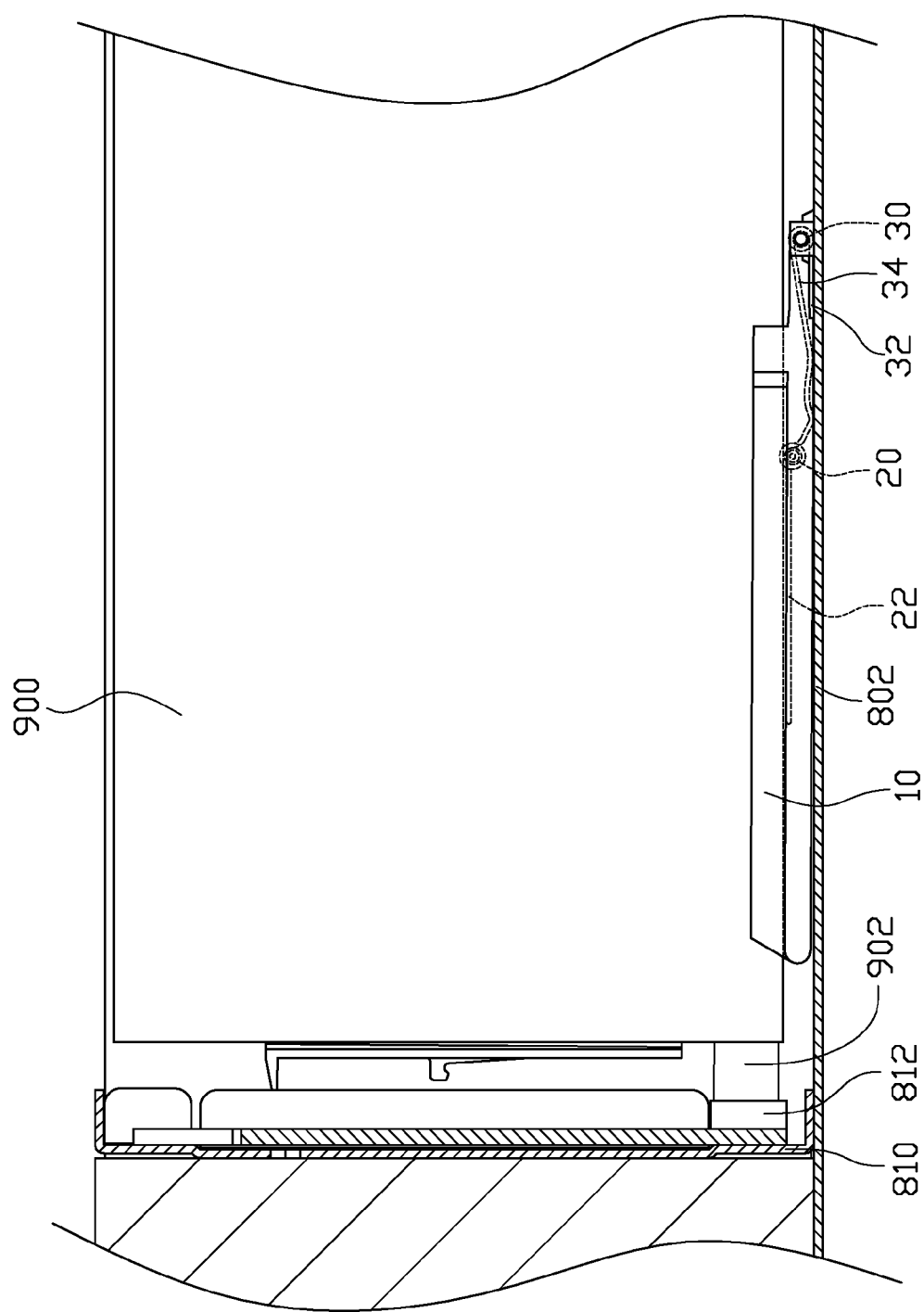

Referring also to FIGS. 7 to 9, during the functional module 900 is pushed into the chassis 800, the connecting bar 26 of the connecting member 226 snaps into the hooks 42 of the functional module 900 before the connectors 902 of the functional module 900 touch with the air flap 10. With the functional module 900 moving forwards, the air flap 10 is urged to pivot about the post 12 via functional module 900 pushing the connecting bar 26, so that an angle β formed between the bottom wall 802 of the chassis 800 and the air flap 10 diminishes continually and the second torsion springs 30 are deformed. The connecting bar 26 remains in the hooks 42 of the functional module 900, so a distance L1 from the root of the first torsion arms 22 to the hooks 42 remains equal to a length L2 of the corresponding first torsion arm 22. The first springs 20 are urged to deform and angle α formed between the air flap 10 and any first torsion arms 22 diminishes continually. When the connectors 902 of the functional module 900 abut against the air flap 10 and urge the air flap 10 to pivot further, the connecting bar 26 disengages from under the hooks 42 of the functional module 900 at the position where the distance L1 begin to be larger than the length L2. The first springs 20 restore. When the functional module 900 is fully received in the chassis 800, the connectors 902 mate with the corresponding connectors 812 of the backplane 810. The air flap 10 lies down under the functional module 900 and the connecting member 226 is received in the groove 18 in the air flap 10.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. An air flap mechanism installed in a server chassis defining an opening for a functional module being inserted therefrom, the air flap mechanism comprising:
   an air flap pivotably installed in the server chassis and capable of shielding the opening of the server chassis,
   a pair of first torsion springs attached to the air flap, a connecting bar connecting between the first torsion springs and capable of being abutted against and engagingly driven by the functional module to pivot the air flap inside the server chassis before the functional module reaches the air flap when the functional module is being pushed into the server chassis.

2. The air flap mechanism as described in claim 1. wherein a pair of first torsion arms respectively extends from the first torsion springs toward the opening of the server chassis, the first torsion arms correspondingly connects with opposite ends of the connecting bar, the function module includes a plurality of hooks extending therefrom configured for engaging with the connecting bar.

3. The air flap mechanism as described in claim 2, wherein an upside down U-shaped groove is defined in a surface of the air flap facing to the opening of the server chassis, the groove is configured for receiving the first torsion arms and the connecting bar.

4. The air flap mechanism as described in claim 3, wherein each first torsion spring forms a second torsion arm to abut against a surface of the air flap opposite to the opening of the server chassis.

5. The air flap mechanism as described in claim 1, wherein a pair of second torsion springs is attached to the air flap, each of second torsion springs comprises a third torsion arm and a fourth torsion arm extending therefrom and abutting against a bottom wall of the server chassis and the air flap respectively.

6. The air flap mechanism as described in claim 5, wherein the air flap defines a pair of channels each configured for receiving one of the fourth torsion arms.

7. The air flap mechanism as described in claim 1, wherein a pair of tabs is formed on a bottom wall of the server chassis, each of the tabs defines a pivoting hole therein, a pair of posts is respectively formed on the bottom end of opposite side edges of the air flap and configured for pivotably received in the pivoting holes of corresponding tabs.

8. A server chassis comprising:
   a plurality of walls cooperatively defining a receiving space for accommodating a functional module therein and an opening in communication with the receiving space for entry of the functional module;
   a spring loaded cover rotatably installed in the receiving space and biased to a closed position to shield the opening; and
   a resilient means extending from the cover towards the opening, and contacting and engagingly driven by the functional module to make the cover to rotate to expose the opening when the functional module slides into the receiving space through the opening, wherein the resilient means comprises a pair of torsion springs attached to the cover and a connecting bar connecting between the torsion springs, the connecting bar is configured to be engagingly pushed by the functional module in response to the functional module sliding into the receiving space via the opening.

9. The server chassis as described in claim 8, wherein each of the torsion springs comprises a first torsion arm extending towards the opening, and opposites ends of the connecting bar connect to distal ends of the first torsion arms of the torsion springs, respectively.

10. The server chassis as described in claim 9, wherein an upside down U-shaped groove is defined in a first surface of the cover facing the opening of the server chassis, the groove is configured for receiving the first torsion arms and the connecting bar.

11. The server chassis as described in claim 10, wherein each of the torsion spring forms a second torsion arm to abut against a surface of the cover opposite to the first surface thereof.

12. The server chassis as described in claim 8, further comprising at least one torsion spring mounted between the cover and one of the walls to bias the cover to the closed position.

13. The server chassis as described in claim 12, wherein said at least one torsion spring comprises a pair of torsion arms abutting against the cover and said one wall, respectively.

14. The server chassis as described in claim 8, wherein the resilient means moves away from the cover to resist against the functional module before the cover reaches the closed position when the functional module slides out of the receiving space.

* * * * *